United States Patent
Ishitani (10) Patent No.: US 9,699,945 B2
(45) Date of Patent: Jul. 4, 2017

(54) COMPONENT MOUNTING METHOD WHICH FITS AND PUSHES COMPONENT ON SUBSTRATE

(75) Inventor: Yasuyuki Ishitani, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 319 days.

(21) Appl. No.: 14/361,160

(22) PCT Filed: Sep. 11, 2012

(86) PCT No.: PCT/JP2012/005760
§ 371 (c)(1),
(2), (4) Date: May 28, 2014

(87) PCT Pub. No.: WO2013/080408
PCT Pub. Date: Jun. 6, 2013

(65) Prior Publication Data
US 2014/0298649 A1    Oct. 9, 2014

(30) Foreign Application Priority Data
Nov. 29, 2011   (JP) .................................. 2011-259948

(51) Int. Cl.
*H05K 13/04* (2006.01)

(52) U.S. Cl.
CPC .... *H05K 13/0408* (2013.01); *Y10T 29/49139* (2015.01); *Y10T 29/53174* (2015.01)

(58) Field of Classification Search
CPC .......... H05K 13/0408; Y10T 29/49139; Y10T 29/53174
See application file for complete search history.

(56) References Cited

U.S. PATENT DOCUMENTS

| 4,510,683 A | * | 4/1985 | Fedde | ..................... B23P 19/00 29/701 |
| 4,598,456 A | * | 7/1986 | McConnell | ............ H05K 13/08 29/33 K |

(Continued)

FOREIGN PATENT DOCUMENTS

| JP | 04-354198 A | 12/1992 |
| JP | 2002-176292 A | 6/2002 |

(Continued)

OTHER PUBLICATIONS

International Search Report for Application No. PCT/JP2012/005760 dated Oct. 23, 2012.

*Primary Examiner* — Minh Trinh
(74) *Attorney, Agent, or Firm* — Pearne & Gordon, LLP (57) ABSTRACT

There is provided a component mounting method for fitting a component including downwardly-extending insertion pins on a substrate by sucking the component by a suction nozzle and moving the suction nozzle such that the insertion pins of the sucked component are inserted into pin insertion holes formed in a substrate. The component mounting method includes: positioning the insertion pins and the pin insertion holes, and then pushing the component against the substrate by the suction nozzle, thereby fitting the component on the substrate such that the insertion pins are inserted into the pin insertion holes; and pushing again the component against the substrate after the component is fitted on the substrate, so as to push the insertion pins into the pin insertion holes.

1 Claim, 5 Drawing Sheets

(56) References Cited

U.S. PATENT DOCUMENTS

| | | | | |
|---|---|---|---|---|
| 4,833,776 A | * | 5/1989 | Wakamiya | H05K 13/0404 29/593 |
| 4,944,086 A | * | 7/1990 | Nishihara | H05K 13/0404 140/147 |
| 6,256,876 B1 | * | 7/2001 | Ohe | H01C 17/242 29/721 |
| 6,513,233 B1 | * | 2/2003 | Nakao | H05K 13/0408 29/739 |
| 2011/0180588 A1 | | 7/2011 | Nagao | |

FOREIGN PATENT DOCUMENTS

| | | |
|---|---|---|
| JP | 2010-027661 A | 2/2010 |
| JP | 2010-87449 A | 4/2010 |

\* cited by examiner

COMPONENT MOUNTING METHOD WHICH FITS AND PUSHES COMPONENT ON SUBSTRATE

TECHNICAL FIELD

The present invention relates to a component mounting method and a component mounting system for sucking a component of pin insertion type by a suction nozzle and fitting the component on a substrate.

BACKGROUND ART

As a related-art component mounting apparatus for fitting a component (a component of pin insertion type) including a plurality of downwardly-extending insertion pins on a substrate, there is known a component mounting apparatus which positions the plurality of insertion pins of the component on a plurality of pin insertion holes of the substrate while nipping the component by a chuck, and which presses the component against the substrate to insert the insertion pins of the component into the pin insertion holes of the substrate (e.g., Patent Document 1). In the component mounting apparatus of this type, the component can be inserted into the substrate while remaining firmly fastened by the chuck. Accordingly, by pushing the component against the substrate only once, the component can surely be fitted on the substrate.

From the viewpoint of versatility of the component mounting apparatus, it has recently become popular to fit a component of the pin insertion type on a substrate by use of a component mounting apparatus (a so-called surface-mounting apparatus) that sucks a component by a suction nozzle and subsequently fits the component on the substrate such that terminals provided on the component are placed on electrodes provided on the substrate.

RELATED ART DOCUMENTS

Patent Documents

Patent Document 1: JP-A-4-354198

SUMMARY OF THE INVENTION

Problem to be Solved by the Invention

However, in the component mounting apparatus of the type which sucks the component of the pin insertion type by the suction nozzle and fits the component on the substrate, when component pushing force does not uniformly act on all insertion pins during fitting of the component on the substrate due to, for example, occurrence of large displacement of the suction nozzle from the component, all or some of the insertion pins may sufficiently be inserted into the pin insertion holes, whereby the component may be fitted in an abnormal posture (e.g., the component may be tilted to the substrate).

An object of the present invention is to provide a component mounting method and a component mounting system which can prevent fitting of a component in an abnormal posture on a substrate due to insufficient insertion of insertion pins into pin insertion holes.

Means for Solving the Problem

The present invention provides a component mounting method for fitting a component including a plurality of downwardly-extending insertion pins on a substrate by sucking the component by a suction nozzle and moving the suction nozzle such that the plurality of insertion pins of the sucked component are inserted into pin insertion holes formed in a substrate, the component mounting method including: a component fitting step of positioning the plurality of insertion pins provided on the component and the plurality of pin insertion holes of the substrate, and then pushing the component against the substrate by the suction nozzle, thereby fitting the component on the substrate such that the insertion pins of the component are inserted into the respective pin insertion holes of the substrate; and a component push-in step of pushing again the component against the substrate after the component is fitted on the substrate, so as to push the insertion pins of the component into the respective pin insertion holes of the substrate.

The present invention provides the component mounting method described above, wherein a position of the component pushed in the component push-in step is different from a position of the component sucked by the suction nozzle in the component fitting step.

The present invention provides the component mounting method described above, wherein the component push-in step is performed by the suction nozzle used in the component fitting step.

The present invention provides the component mounting method described above, wherein the component push-in step is performed by a suction nozzle other than the suction nozzle used in the component fitting step.

The present invention provides the component mounting method described above, an inspection step of inspecting a posture of the component fitted on the substrate is performed after the component fitting step, and wherein the component push-in step is performed only for the component determined to be fitted on the substrate in an abnormal posture in the inspection step.

The present invention provides a component mounting system including: a fitting head which sucks a component including a plurality of downwardly-extending insertion pins by a suction nozzle and which operates the suction nozzle such that the plurality of insertion pins of the sucked component are inserted into pin insertion holes formed in a substrate, thereby fitting the component on the substrate; and fitting head operation control means which operates the fitting head to: position the plurality of insertion pins provided on the component and the plurality of pin insertion holes of the substrate, and then push the component against the substrate by the suction nozzle, thereby fitting the component on the substrate such that the insertion pins provided on the component are inserted into the respective pin insertion holes of the substrate; and thereafter push again the component against the substrate by the suction nozzle used for fitting the component on the substrate or a suction nozzle other than the suction nozzle used for fitting the component on the substrate such that the insertion pins of the component are pushed into the respective pin insertion holes of the substrate.

Advantages of the Invention

In the present invention, after fitted on the substrate, the component is pushed against the substrate again, whereby the insertion pins of the component are pushed into the corresponding pin insertion holes of the substrate. Therefore, even when some of the insertion pins are not sufficiently inserted into the respective pin insertion holes in first pushing process of the component (a component fitting step), the insertion pins can be sufficiently inserted into the pin insertion holes in second pushing process of the component (a component push-in step). Accordingly, it is possible to prevent fitting of the component in an abnormal posture on the substrate.

MODE FOR CARRYING OUT THE INVENTION

Figure 1:
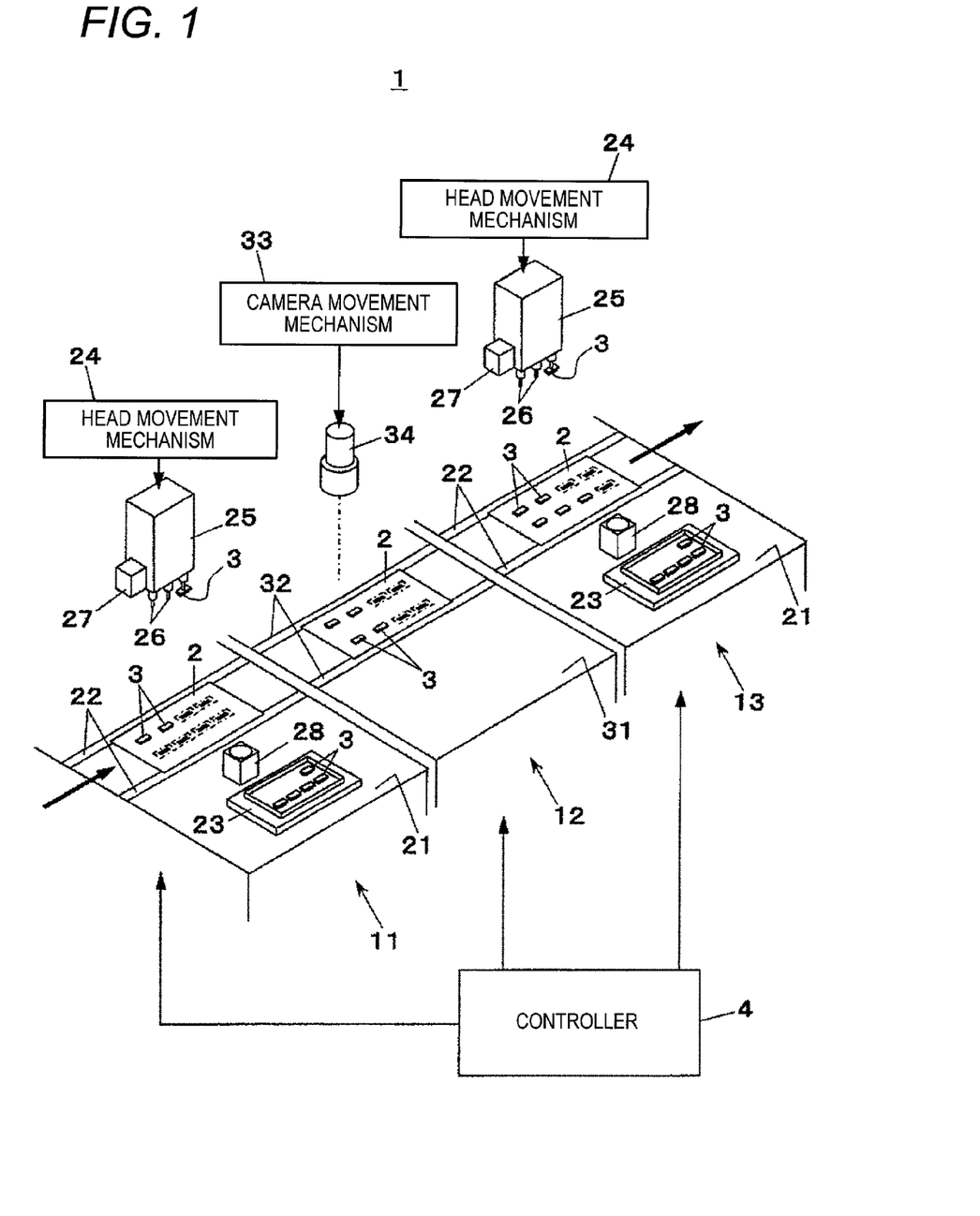
FIG. 1 is a block diagram of a component mounting system of an embodiment of the present invention.

Hereinafter, an embodiment of the present invention is described with reference to the drawings. In FIG. 1, a component mounting system 1 includes: a first component mounting apparatus 11 which fits a component 3 on a substrate 2; an inspection apparatus 12 which inspects the substrate 2 on which the component 3 is fitted by the first component mounting apparatus 11; and a second component mounting apparatus 13 which fits another component 3 on the substrate 2 that is inspected by the inspection apparatus 12. The first component mounting apparatus 11, the inspection apparatus 12, and the second component mounting apparatus 13 are arranged in this sequence in a direction of conveyance of the substrate 2 (referred to as an X-axis direction). A common controller 4 controls the first component mounting apparatus 11, the inspection apparatus 12, and the second component mounting apparatus 13.

The first component mounting apparatus 11 includes: a conveyor 22 provided on a base 21, which conveys the substrate 2 and which positions the substrate 2 to a predetermined position; a component supplying unit 23, such as a tray feeder, which is disposed lateral to the conveyor 22 and which supplies the component 3; and a head movement mechanism 24 which includes a Cartesian coordinate robot. The head movement mechanism 24 is configured to move a fitting head 25. The fitting head 25 includes a plurality of suction nozzles 26 which extend downward and which can move up and down and rotate about a vertical axis. The fitting head 25 includes a substrate camera 27 provided to have downwardly-oriented field of view. In addition, a component camera 28 provided to have upwardly-oriented field of view is disposed between the conveyor 22 and the component supplying unit 23 on the base 21.

In FIG. 1, the controller 4 controls operation of the conveyor 22 to convey and position the substrate 2, and controls operation of the head movement mechanism 24 to move the fitting head 25 and the substrate camera 27 within a horizontal plane. The controller 4 further controls operation of each suction nozzle 26 of the fitting head 25 to move up and down and rotate about the vertical axis, and operation of the each suction nozzle 26 to suck the component 3 from the component supplying unit 23. Accordingly, the controller 4 controls imaging operation of the substrate camera 27 to obtain an image of the substrate 2, and imaging operation of the component camera 28 to obtain an image of the component 3 sucked by the fitting head 25 (the suction nozzles 26). Image data obtained by the imaging operation of the substrate camera 27 and image data obtained by the imaging operation of the component camera 28 are sent to the controller 4, and the controller 4 performs image recognition processing based on the image data.

Figure 2:
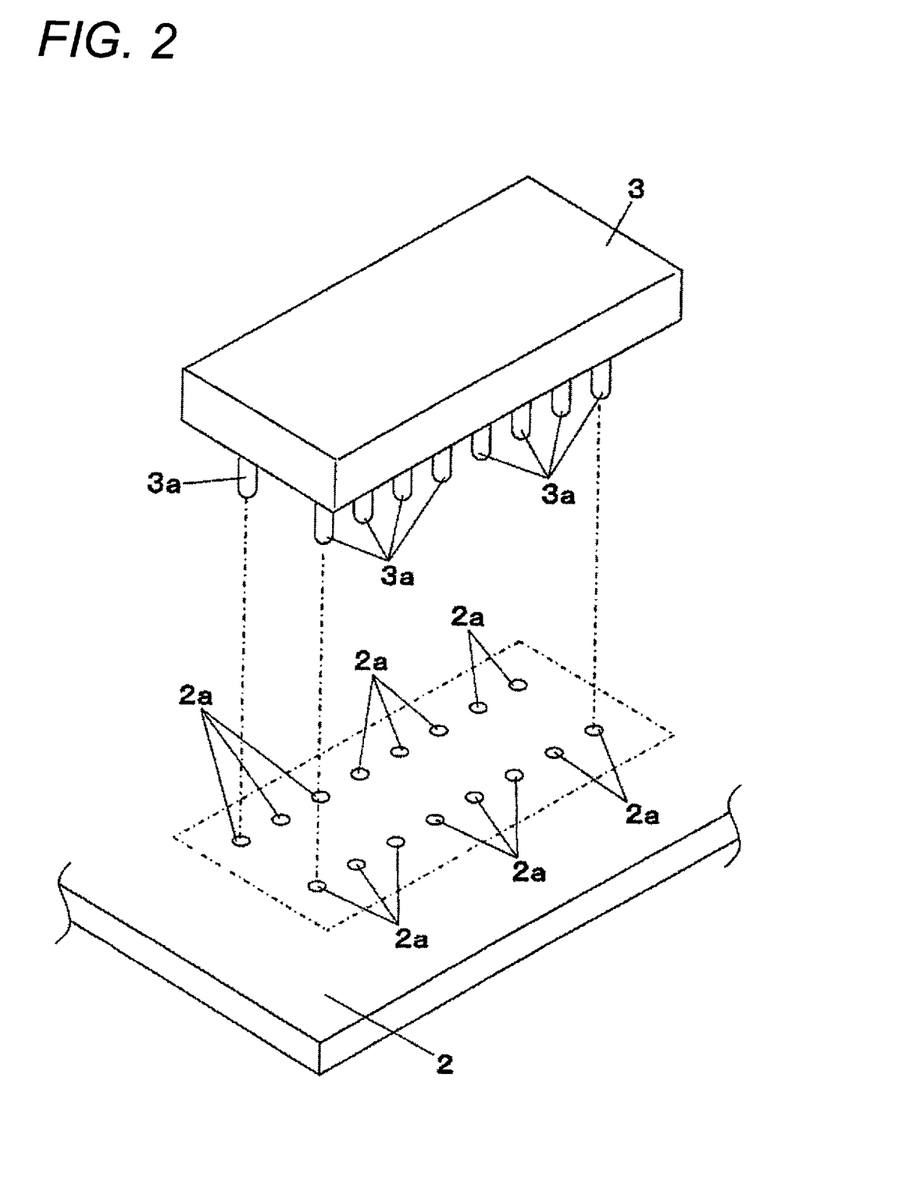
FIG. 2 is a perspective view of a substrate and a component of the embodiment of the present invention.

In FIG. 2, the component 3 is formed by a component of the pin insertion type which includes a plurality of insertion pins 3a which extend downward from a lower surface of the component 3. A plurality of pin insertion holes 2a, which allow the insertion pins 3a provided on the component 3 to be inserted therein, are formed in the substrate 2 so as to correspond to the components 3. Therefore, when the insertion pins 3 provided on the component 3 are situated above the corresponding pin insertion holes 2a of the substrate 2, and then the component 3 is lowered relative to the substrate 2, the insertion pins 3a can be inserted into the respective pin insertion holes 2a.

Next, process for performing component mounting operation for fitting the component 3 on the substrate 2 by the first component mounting apparatus 11 will be described. In the component mounting operation, the controller 4 first operates the conveyor 22, the substrate 2 sent from another device (not shown) provided for an upstream process is received and delivered, and positioned to a predetermined operation position (a position shown in FIG. 1). The controller 4 controls operation of the head movement mechanism 24, whereby the fitting head 25 moves to a position above the component supplying unit 23, and the suction nozzle 26 sucks the component 3 by vacuum suction (a component sucking step).

After the suction nozzle 26 sucks the component 3, the controller 4 operates the head movement mechanism 24, whereby the fitting head 25 moves to allow the component 3 sucked by the suction nozzle 26 to pass by a position above the component camera 28, and the component camera 28 obtains an image of the component 3. Based on the obtained image, the controller 4 detects positions of the plurality of insertion pins 3a provided on each component 3 (an insertion pin position detection step).

After detecting the positions of the respective insertion pins 3a of each component 3, the controller 4 moves the fitting head 25 to a position above the substrate 2 positioned by the conveyor 22. The substrate camera 27 obtains an image from above an area of the substrate 2 on which the component 3 is to be fitted. Based on the obtained image, the controller 4 detects positions of the respective pin insertion holes 2a into which the insertion pins 3a of the component 3 are to be inserted (a pin insertion hole position detection step).

After detecting the positions of the respective pin insertion holes 2a of the substrate 2, based on the positions of the respective insertion pins 3a detected in the insertion pin position detection step and the positions of the respective pin insertion holes 2a detected in the pin insertion hole position detection step, the controller 4 moves the fitting head 25 so as to locate the insertion pins 3a at positions immediately above the corresponding pin insertion holes 2a (the corresponding insertion pins 3a are aligned with the pin insertion holes 2a in the vertical direction), and then lowers the suction nozzle 26. Consequently, the component 3 is fitted on the substrate 2 such that the insertion pins 3a of the component 3 are inserted into the corresponding pin insertion holes 2a of the substrate 2 from above (a component fitting step).

After fitting the component 3 on the substrate 2, the controller 4 moves the suction nozzle 26 upward relatively to the fitting head 25 such that lower ends of the suction nozzle 26 is moved upward to separate from the component 3. Then, the controller 4 moves the fitting head 25 horizontal over a minute distance, and pushes the component 3 against the substrate 2 again by the suction nozzle 26 (a component push-in step). Consequently, the insertion pins 3a of the component 3 are pushed into the corresponding pin insertion holes 2a of the substrate 2 again. Therefore, even when some of the insertion pins 3a are not sufficiently inserted into the corresponding pin insertion holes 2a in first pushing process of the component 3 (i.e., the component fitting step), the insertion pins 3a can be sufficiently inserted into the pin insertion holes 2a in second pushing process of the component (the component push-in step).

Figure 3A:
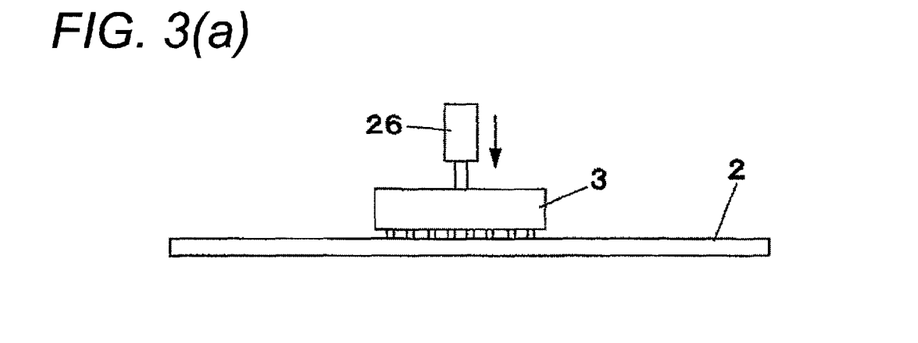
FIGS. 3(a), 3(b) and 3(c) show an example of component push-in pattern of the embodiment of the present invention.
Figure 3B:
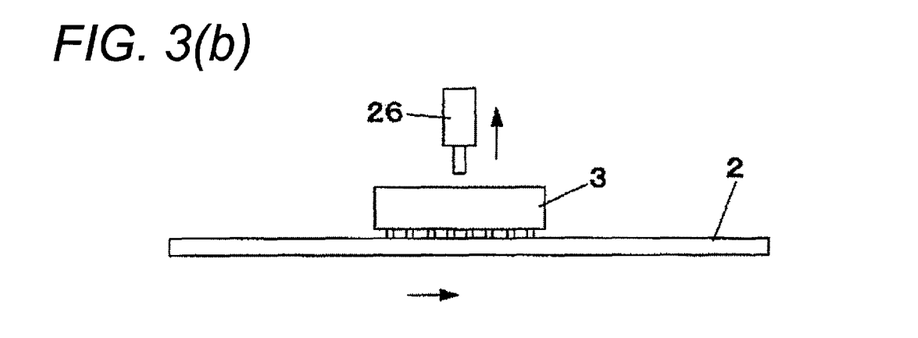
Figure 3C:
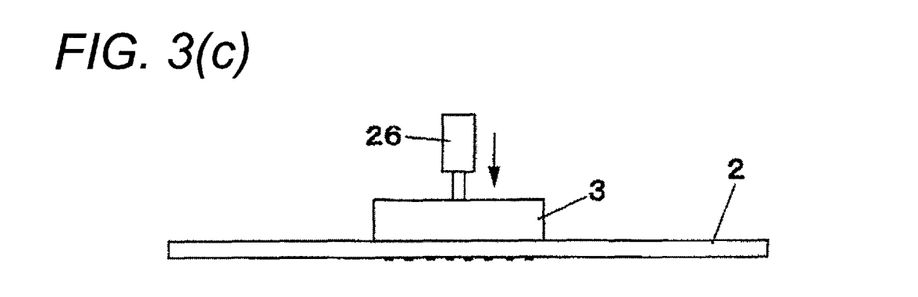
Figure 4A:
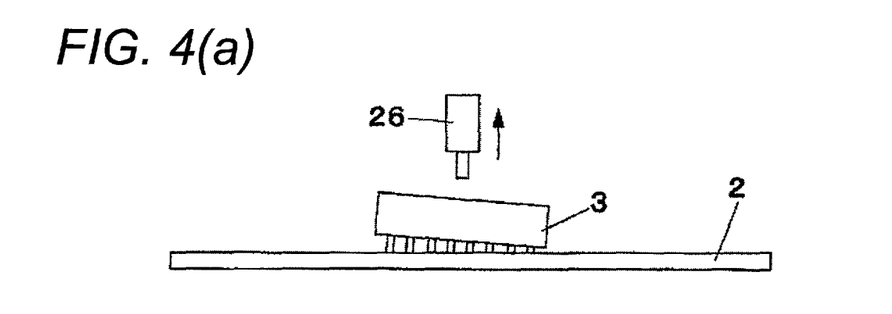
FIGS. 4(a), 4(b) and 4(c) show an example of component push-in pattern of the embodiment of the present invention.
Figure 4B:
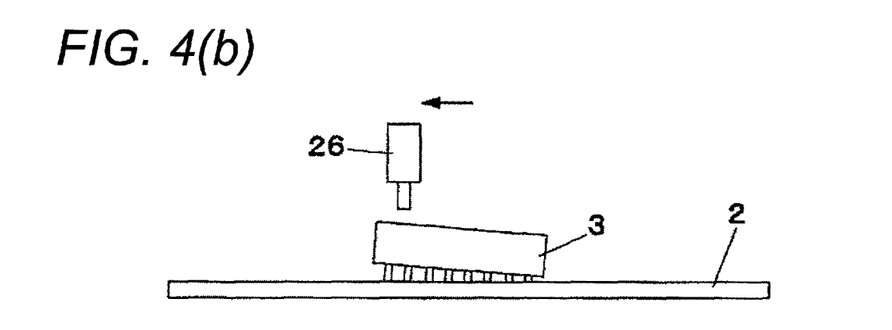
Figure 4C:
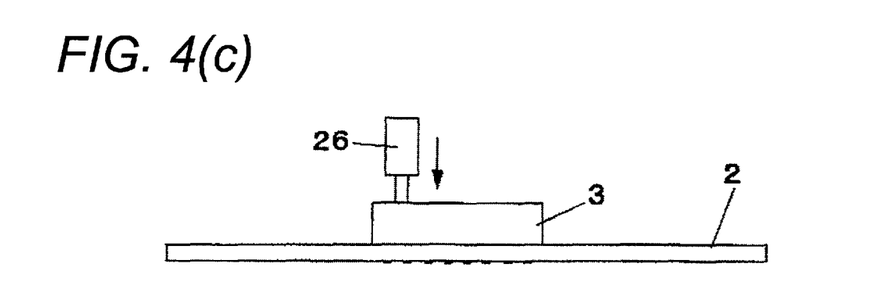

The following are exemplified patterns for pushing the component 3 in the component push-in step includes. A first exemplified pattern is, as shown by a sequence of FIG. 3(a)→FIG. 3(b)→FIG. 3(c), a pattern in which the component 3 is again pushed by the suction nozzle 26 at a position of the component 3 identical with the position of the component 3 having been sucked by the suction nozzle 26. A second exemplified pattern is, as shown by a sequence of FIG. 4(a)→FIG. 4(b)→FIG. 4(c), a pattern in which the component 3 is again pushed by the suction nozzle 26 at a position of the component 3 different from the position of the component 3 having been sucked by the suction nozzle 26. Each of the patterns may be used alone, or the patterns may be used in combination (in a consecutive manner). According to the first exemplified pattern, when all of the insertion pins 3a of the component 3 are insufficiently inserted into the pin insertion holes 2a (the component 3 is not tilted to the substrate 2 as shown in FIG. 3(a) in this case), the component 3 can be firmly fitted on the substrate 2 by pushing again the same position. On the other hand, according to the second exemplified pattern, when some of the insertion pins 3a of the component 3 are insufficiently inserted into the pin insertion holes 2a (the component 3 is tilted with respect to the substrate 2 as shown in FIG. 4(a) in this case), the fitted posture of the component 3 can be made normal.

Figure 5A:
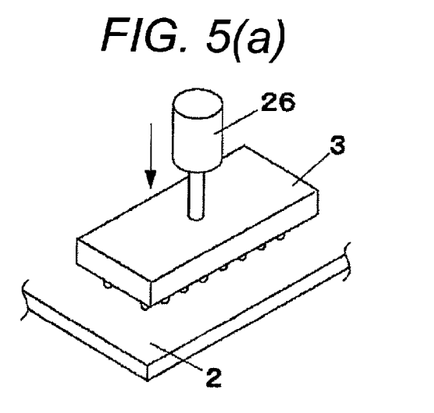
FIGS. 5(a) to 5(f) show an example of component push-in pattern of the embodiment of the present invention.
Figure 5B:
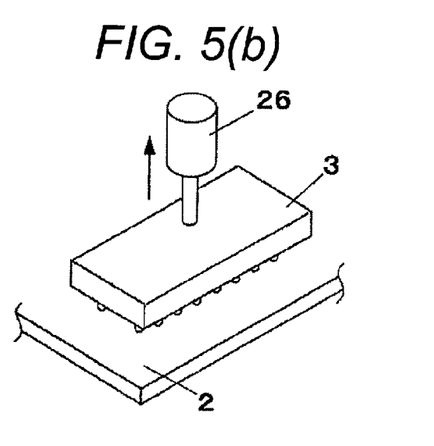
Figure 5C:
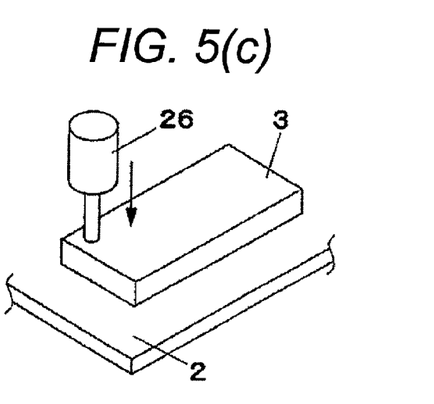
Figure 5D:
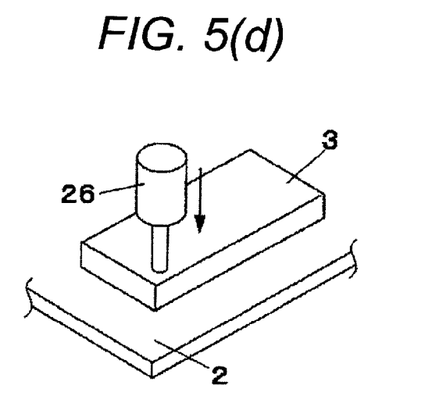
Figure 5E:
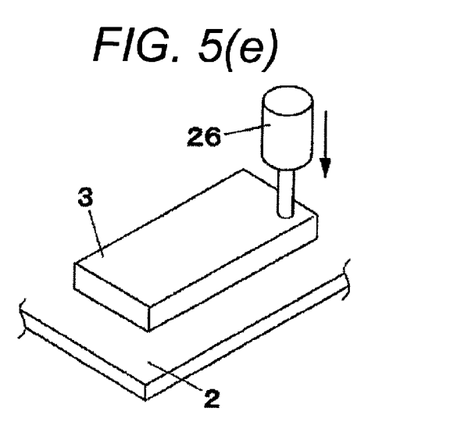
Figure 5F:
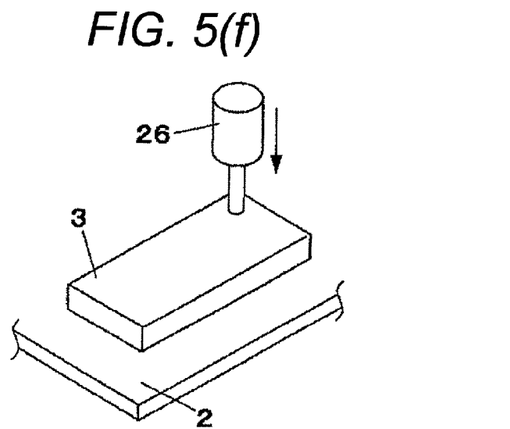

Moreover, in the second exemplified pattern in which the pickup nozzle 26 pushes again the component 3 at the position on the component 3 different from the position of the component 3 having been sucked by the suction nozzle 26, the suction nozzle 26 may push a plurality of different positions of the component 3. In this case, in addition to a pattern of pushing four corners of the component 3 as shown by a sequence of FIG. 5(a)→FIG. 5(b)→FIG. 5(c)→FIG. 5(d)→FIG. 5(e)→FIG. 5(f) in order to address a case in which the tilted posture of the component 3 is unknown, another conceivable pattern includes pushing intermediate positions of respective four sides of the component 3.

After fitting the component 3 on the substrate 2 and then pushing again the component 3 into the substrate 2, the controller 4 determines whether fitting of all of the components 3 to be fitted is finished on the substrate 2 on which the component 3 is fitted this time (a determination step). If the fitting of all of the components 3 to be fitted is determined not to be finished on the substrate 2 on which the component 3 is fitted this time, processing returns to the component sucking step to newly suck the component 3. If the fitting of all of the components 3 to be fitted is determined to be finished on the substrate 2 on which the component 3 is fitted this time, the component mounting operation on the substrate 2 is terminated, and the substrate 2 is discharged to the inspection apparatus 12 provided for the downstream process.

In FIG. 1, under control of the controller 4, the inspection apparatus 12 receives the substrate 2 discharged from the first component mounting apparatus 11 and positions it to a predetermined operation position by a conveyor 32 provided on a base 31. The inspection apparatus 12 also moves an inspection camera 34 provided to have a downwardly-oriented field of view within a horizontal plane by a camera movement mechanism 33 which includes a Cartesian coordinate robot placed on the base 31, and inspects a posture of the component 3 fitted on the substrate 2 (an inspection step). After completing the inspection step, the inspection apparatus 12 operates the conveyor 32, thereby discharging the substrate 2 to the second component mounting apparatus 13 provided for the downstream process.

In FIG. 1, the configuration of the second component mounting apparatus 13 is the same as or similar to the configuration of the first component mounting apparatus 11. Consequently, elements of the second component mounting apparatus 13 which are the same or similar to those of the first component mounting apparatus 11 are assigned the reference numerals used for describing the first component mounting apparatus 11. The second component mounting apparatus 13 performs operation of fitting the components 3 (to positions on the substrate 2 where the first component mounting apparatus 11 does not fit any component) allocated to the second component mounting apparatus 13. After completion of the component mounting operation, the second component mounting apparatus 13 discharges the substrate 2 by the conveyor 22 to another apparatus (not shown) provided for the downstream process.

As described above, the component mounting system 1 of the embodiment includes a fitting head 25 and the controller 4. The fitting head 25 sucks the component 3 including the plurality of downwardly-extending insertion pins 3a by the suction nozzle 26, and operates the suction nozzle 26 such that the plurality of insertion pins 3a of the sucked component 3 are inserted into the pin insertion holes 2a formed in the substrate 2, thereby fitting the component 3 on the substrate 2. The controller 4 serving as fitting head activation control means which operates the fitting head 25 to: position the plurality of insertion pins 3a provided on the component 3 and the plurality of pin insertion holes 2a of the substrate 2, and then push the component 3 against the substrate 2 by the suction nozzle 26, thereby fitting the component 3 on the substrate 2 such that the insertion pins 3a provided on the component 3 are inserted into the respective pin insertion holes 2a of the substrate 2; and thereafter push again the component 3 against the substrate 2 by the suction nozzle 26 such that the insertion pins 3a of the component 3 are pushed into the respective pin insertion holes 2a of the substrate 2.

The component mounting method performed by the component mounting system 1 of the embodiment includes: a step (a component fitting step) of positioning the plurality of insertion pins 3a provided on the component 3 and the plurality of pin insertion holes 2a of the substrate 2, and then pushing the component 3 against the substrate 2 by the suction nozzle 26, thereby fitting the component 3 on the substrate 2 such that the insertion pins 3a provided on the component 3 are inserted into the respective pin insertion holes 2a of the substrate 2, and a step (a component push-in step) of pushing again the component 3 against the substrate 2 after the component 3 is fitted on the substrate 2, so as to push the insertion pins 3a of the component 3 into the respective pin insertion holes 2a of the substrate.

As described above, according to the component mounting system 1 and the component mounting method of the embodiment, after the component 3 is fitted on the substrate 2, the component 3 is again pushed against the substrate 2, whereby the insertion pins 3a of the component 3 are pushed into the pin insertion holes 2a of the substrate 2. Therefore, even when some of the insertion pins 3a are not sufficiently inserted into the respective pin insertion holes 3a during the first pushing process for pushing the component 3 (the component fitting step), the insertion pins 3a can be sufficiently inserted into the pin insertion holes 2a in the second pushing process for pushing the component 3 (the component push-in step). Accordingly, it is possible to prevent fitting of the component 3 in the abnormal posture on the substrate 2.

In the embodiment, the first component mounting apparatus 11 performs the component push-in step after performing the component fitting step. However, the second component mounting apparatus 13 provided for the downstream process may perform the component push-in step after the first component mounting apparatus 11 performs the component fitting step. Specifically, the component push-in step may be performed by the suction nozzle used in the component fitting step (the suction nozzle 26 provided in the first component mounting apparatus 11), and/or may also be performed by another suction nozzle other than the suction nozzle used in the component fitting step (i.e., by the suction nozzle 26 provided in the second component mounting apparatus 13). In the embodiment, the apparatus provided for the downstream process is the component mounting apparatus including the suction nozzles (i.e., the second component mounting apparatus 13). However, another apparatus not including the suction nozzles may perform the component push-in step by use of pushing means other than the suction nozzles. In a case in which the second component mounting apparatus 13 provided for the downstream process performs the component push-in step after the first component mounting apparatus 11 performs the component fitting step, only the component 3 determined to be fitted on the substrate 2 in an abnormal posture by the inspection apparatus 12 in the inspection step may be subjected to pushing by pushing a position which can correct the abnormal posture of the component 3.

This application is based on Japanese Patent Application (Application No. 2011-259948) filed on Nov. 29, 2011, the entire contents of which are incorporated herein by reference.

INDUSTRIAL APPLICABILITY

There are provided a component mounting method and a component mounting system which can prevent fitting of the component in an abnormal posture on a substrate due to insufficient insertion of insertion pins into pin insertion holes.

DESCRIPTION OF REFERENCE SIGNS

1: Component Mounting System
2: Substrate
2a: Pin Insertion Hole
3: Component
3a: Insertion Pin
4: Controller (Fitting Head Activation Control Means)
25: Fitting Head
26: Suction Nozzle

The invention claimed is:

1. A component mounting method for fitting a component comprising a plurality of downwardly-extending insertion pins on a substrate by sucking the component by a suction nozzle and moving the suction nozzle such that the plurality of insertion pins of the sucked component are inserted into pin insertion holes formed in a substrate, said component mounting method comprising:
   positioning the plurality of insertion pins provided on the component and the plurality of pin insertion holes of the substrate, and then pushing the component against the substrate by the suction nozzle, thereby fitting the component on the substrate such that the insertion pins of the component are inserted into the respective pin insertion holes of the substrate; and
   pushing again the component against the substrate after the component is fitted on the substrate, so as to push the insertion pins of the component into the respective pin insertion holes of the substrate,
   wherein a position of the component when pushed again is different from a position of the component when sucked by the suction nozzle and is a position which corrects the abnormal posture of the component, and
   wherein the component is pushed again by a suction nozzle other than the suction nozzle used for fitting the component, and
   the component mounting method further comprises:
   inspecting a posture of the component fitted on the substrate is performed after fitting the component,
   wherein the component is pushed again only for the component determined to be fitted on the substrate in an abnormal posture in the inspection step.

* * * * *